United States Patent [19]
Watanabe et al.

[11] Patent Number: 5,972,559
[45] Date of Patent: Oct. 26, 1999

[54] CHEMICALLY AMPLIFIED POSITIVE RESIST COMPOSITIONS

[75] Inventors: Satoshi Watanabe; Katsuya Takemura; Shigehiro Nagura, all of Nakakubiki-gun, Japan

[73] Assignee: Shin-Etsu Chemical Co., Ltd., Japan

[21] Appl. No.: 08/884,503

[22] Filed: Jun. 27, 1997

[30] Foreign Application Priority Data

Jun. 28, 1996 [JP] Japan .................................... 8-188461

[51] Int. Cl.$^6$ .................................................. G03F 7/004
[52] U.S. Cl. ...................................... 430/270.1; 430/905
[58] Field of Search ................................ 430/270.1, 905

[56] References Cited

U.S. PATENT DOCUMENTS

| | | | |
|---|---|---|---|
| 5,310,619 | 5/1994 | Crivello et al. | |
| 5,352,564 | 10/1994 | Takeda et al. | 430/270.1 |
| 5,627,006 | 5/1997 | Urano et al. | 430/270.1 |
| 5,683,856 | 11/1997 | Aoai et al. | 403/270.1 |
| 5,736,296 | 4/1998 | Sato et al. | 430/270.1 |
| 5,750,309 | 5/1998 | Hatakeyama et al. | 430/905 |
| 5,824,824 | 10/1998 | Osawa et al. | 430/270.1 |

FOREIGN PATENT DOCUMENTS

| | | |
|---|---|---|
| 0679951 | 1/1997 | European Pat. Off. . |
| 63-27829 | 2/1988 | Japan . |
| 227660 | 6/1990 | Japan . |

*Primary Examiner*—John S. Chu
*Attorney, Agent, or Firm*—Millen, White, Zelano & Branigan, P.C.

[57] ABSTRACT

A chemically amplified positive resist composition is prepared by blending (A) an organic solvent, (B) a base resin in the form of a polyhydroxystyrene having some hydroxyl groups replaced by acid labile groups and a Mw of 3,000–300,000, (C) a photoacid generator, and (D) an aromatic compound having a group: —$R^{13}$—COOH in a molecule. The resist composition is sensitive to actinic radiation, especially KrF excimer laser and X-ray, has high sensitivity, resolution, and plasma etching resistance, and is effective for improving the footing and PED on nitride substrates.

14 Claims, No Drawings

CHEMICALLY AMPLIFIED POSITIVE RESIST COMPOSITIONS

BACKGROUND OF THE INVENTION

1. Field of the Invention

This invention relates to a chemically amplified positive resist composition which is highly sensitive to actinic radiation such as deep-UV, electron beam and X-ray, developable with aqueous base to form a pattern, and suitable for fine processing.

2. Prior Art

As the LSI technology tends toward higher integration and higher speed, further refinement of pattern rules is required. The current patterning technology mostly relies on light exposure which is now approaching to the essential limit of resolution which is dictated by the wavelength of a light source. It is generally recognized that in light exposure using g-line (wavelength 436 nm) or i-line (wavelength 365 nm) as a light source, a pattern rule of about 0.5 μm is the limit. For LSIs fabricated by such light exposure technique, a degree of integration equivalent to 16 mega-bit DRAM is the limit. At present, LSIs fabricated in the laboratory have reached this stage. It is urgently required to develop a finer patterning technique.

Under such circumstances, deep-ultraviolet lithography is regarded promising as the next generation of fine patterning technology. The deep-UV lithography is capable of working on the order of 0.3 or 0.4 μm and makes it possible to form a resist pattern having a side wall nearly perpendicular to the substrate if a less light absorbing resist material is used. Advanced engineers place focus on the utilization of a high illuminance KrF excimer laser (wavelength 248 nm) as a deep-UV source. A resist material having low light absorption and high sensitivity must be developed before such an excimer laser can be used in a mass scale manufacturing technique.

From this point of view, a number of chemically amplified positive working resist materials using acid catalysts were recently developed as disclosed in U.S. Pat. Nos. 4,491,628, 5,310,619 and 5,362,607. These materials have high sensitivity, resolution and dry etching resistance and are promising as resist materials especially suited for deep-UV lithography. The chemically amplified, positive resist materials being known include those of the two-component system comprising an alkali-soluble base resin and a photoacid generator and those of the three-component system comprising an alkali-soluble base resin, a photoacid generator, and a dissolution inhibitor having an acid labile group. For these resist materials, it is desired to improve footing on nitride film substrates and post exposure delay (PED).

EP 679951 discloses a positive resist composition comprising a mixture of a polyhydroxystyrene having 10 to 60 mol% of the hydroxyl groups replaced by tert-butoxycarbonyl groups and a polyhydroxystyrene having 10 to 60 mol% of the hydroxl groups replaced by acetal groups and an organic carboxylic acid. This composition has the drawback of low resolution due to the use of a polymer mixture. Additionally, the composition is difficult to coat uniformly because many organic carboxylic acids such as monovalent or polyvalent aliphatic carboxylic acids, alicyclic carboxylic acids, unsaturated aliphatic carboxylic acids, oxycarboxylic acids, alkoxycarboxylic acids, and ketocarboxylic acids are less compatible with the polymers due to the absence of a phenyl group. Of the organic carboxylic acids, benzoic acid derivatives cannot be added in amounts of more than 1% by weight based on the weight of the resin component and photoacid generator combined because they show significant absorption at wavelengths of about 248 nm and reduce the transmittance and resolution of resists. For these reasons, the composition of EP 679951 is least effective for improving the footing on nitride film substrates and PED.

SUMMARY OF THE INVENTION

An object of the present invention is to provide a novel and improved chemically amplified positive resist composition which has a resolution high enough to lend itself to the fine processing technique and is effective for improving the footing on nitride film substrates and PED.

We have found that a chemically amplified positive resist composition comprising (A) an organic solvent, (B) a base resin in the form of a polymer of the following formula (1) having a weight average molecular weight of 3,000 to 300,000, (C) a photoacid generator, and (D) an aromatic compound having a group: ≡C—COOH in a molecule has a resolution high enough to lend itself to the fine processing technique and is effective for improving the footing on nitride film substrates and PED. The resist composition is most effective when processed by deep-UV lithography.

The polymer used as base resin (B) is of the general formula (1):

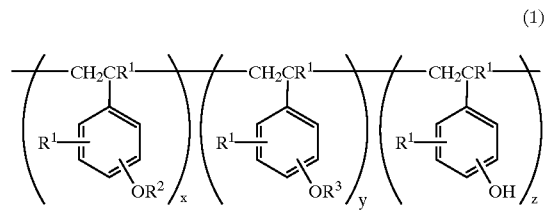

wherein $R^1$ is hydrogen or methyl,
$R^2$ is a group of the following general formula (2):

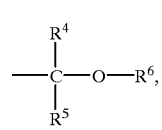

$R^3$ is an acid labile group different from $R^2$,
$R^4$ and $R^5$ are independently selected from the group consisting of hydrogen and normal or branched alkyl groups having 1 to 6 carbon atoms, $R^6$ is a normal, branched or cyclic alkyl group having 1 to 10 carbon atoms, or $R^4$ and $R^5$, $R^4$ and $R^6$, or $R^5$ and $R^6$, taken together, may form a ring, and $R^4$, $R^5$ and $R^6$ are independently selected from normal or branched alkylene groups having 1 to 6 carbon atoms when they form a ring, letters x and y each are 0 or a positive number with the proviso that both x and y are not equal to 0 at the same time, z is a positive number, and x, y and z satisfy the relationships: $0 \leq x/(x+y+z) < 0.5$, $0 \leq y/(x+y+z) \leq 0.5$, and $0.4 \leq z/(x+y+z) \leq 0.9$.

A chemically amplified positive resist composition predominantly comprising a polymer of formula (1) having a weight average molecular weight of 3,000 to 300,000, that is, a polyhydroxystyrene derivative having some hydroxyl groups replaced by acid labile groups as base resin (B) and an aromatic compound having a ≡C—COOH group in a molecule as component (D) has a high dissolution contrast owing to the effect of the acid labile group the base resin of formula (1) possesses and the alkali solubility of the aromatic compound having a ≡C—COOH group and a high resolution suitable for a fine processing technique owing to the effect of the aromatic compound having a ≡C—COOH group to compensate for the basic impurities from the nitride film substrate and air. The composition is also effective for improving footing on the nitride film substrate and PED.

DETAILED DESCRIPTION OF THE INVENTION

The chemically amplified positive resist composition of the invention can be used as either a three-component system comprising a base resin, a photoacid generator, and an aromatic compound having a ≡C—COOH group in a molecule or a four-component system comprising a base resin, a photoacid generator, an aromatic compound having a ≡C—COOH group in a molecule, and a basic compound or dissolution controller. Preferably the chemically amplified positive resist composition of the invention is used as a three-component system. Preferably the resist composition contains, in parts by weight, (A) 150 to 700 parts, more preferably 250 to 500 parts of an organic solvent, (B) 70 to 90 parts, more preferably 75 to 85 parts of a base resin, (C) 0.5 to 15 parts, more preferably 1 to 8 parts of a photoacid generator, (D) 0.1 to 5 parts, more preferably 1 to 3 parts of an aromatic compound having a ≡C—COOH group in a molecule, and (E) 0 to 2 parts, more preferably 0.01 to 1 parts of a basic compound. The amounts of the respective components are described hereinafter on the basis of this mix proportion.

Examples of the organic solvent (A) include ketones such as cyclohexanone, 2-heptanone, 3-heptanone, and 4-heptanone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, diethylene glycol dimethyl ether, ethylene glycol-tert-butyl ether methyl ether (1-tert-butoxy-2-methoxyethane), and ethylene glycol-tert-butyl ether ethyl ether (1-tert-butoxy-2-ethoxyethane); and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and methyl β-methoxyisobutyrate alone or in admixture of two or more. The preferred solvents are 1-ethoxy-2-propanol ensuring solubility of resist components and propylene glycol monomethyl ether acetate (α and β types) ensuring safety and solubility of resist components.

Since a resist coating of 0.4 to 4 μm thick is appropriate, the organic solvent as component (A) is preferably blended in an amount of 150 to 700 parts by weight, more preferably 250 to 500 parts by weight. Compositions containing less than 150 parts of the organic solvent would be somewhat inefficient to apply and would form a rather thick coating whereas compositions containing more than 700 parts of the organic solvent would form a rather thin coating.

The base resin as component (B) is a polymer of the following general formula (1), preferably formula (3), having a weight average molecular weight of 3,000 to 300,000.

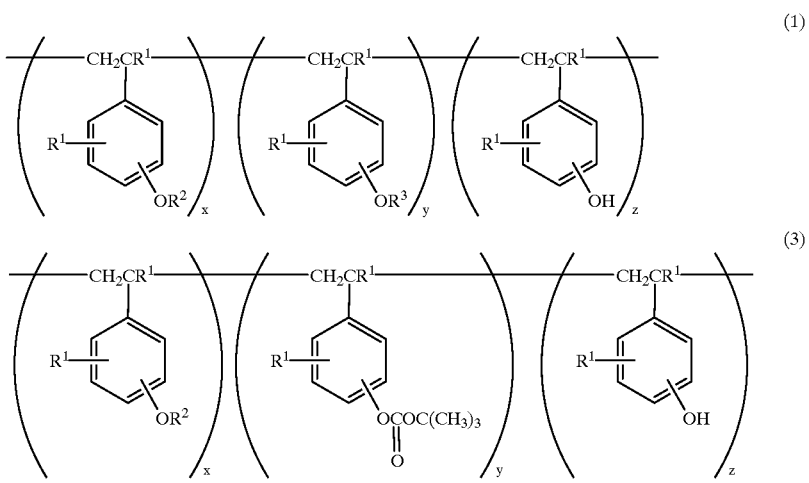

In the formulae, $R^1$ is hydrogen or methyl. $R^2$ is a group of the following general formula (2). $R^3$ is an acid labile group different from $R^2$. $R^3$ may be a group of formula (2) insofar as it is different from $R^2$.

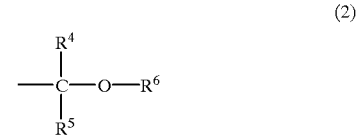

In formula (2), $R^4$ and $R^5$ are independently hydrogen or normal or branched alkyl groups having 1 to 6 carbon atoms, $R^6$ is a normal, branched or cyclic alkyl group having 1 to 10 carbon atoms. Alternatively, $R^4$ and $R^5$, $R^4$ and $R^6$, or $R^5$ and $R^6$, taken together, may form a ring. $R^4$, $R^5$ and $R^6$ are independently selected from normal or branched alkylene groups having 1 to 6 carbon atoms when they form a ring.

Illustrative examples of the group of formula (2) include normal or branched acetals groups such as 1-ethoxyethyl, 1-n-propoxyethyl, 1-iso-propoxyethyl, 1-n-butoxyethyl, 1-iso-butoxyethyl, 1-sec-butoxyethyl, 1-tert-butoxyethyl, 1-tert-amyloxyethyl, 1-ethoxy-n-propyl, and 1-cyclohexyloxyethyl groups; and cyclic acetal groups such as tetrahydrofuranyl and tetrahydropyranyl groups. Preferred are 1-ethoxyethyl, 1-n-butoxyethyl and 1-ethoxy-n-propyl groups.

Accordingly, $R^2$ can be selected from these illustrative groups. $R^3$ can also be selected from these groups (but different from $R^2$) and tert-butyl derivative groups such as tert-butyl, tert-butoxycarbonyl and tert-butoxycarbonylmethyl groups and β-ketoalkyl groups such as 3-oxycyclohexyl, with the tert-butoxycarbonyl group being preferred.

In formulae (1) and (3), letters x and y each are 0 or a positive number with the proviso that both x and y are not equal to 0 at the same time, and z is a positive number. The compositional ratio represented by x, y and z should satisfy the relationships: $0 \leq x/(x+y+z) \leq 0.5$, preferably $0.1 \leq x/(x+y+z) \leq 0.4$, $0 \leq y/(x+y+z) \leq 0.5$, preferably $0 \leq y/(x+y+z) \leq 0.2$, and $0.4 \leq z/(x+y+z) \leq 0.9$, preferably $0.6 \leq z/(x+y+z) \leq 0.8$. If the ratio of x to the sum of x+y+z is more than 0.5 or if the ratio of y to the sum is more than 0.5 or if the ratio of z to the sum is more than 0.9 or if the ratio of z to the sum is less than 0.4, the contrast of alkali dissolution rate is reduced and resolution is exacerbated. By properly selecting the values of x, y and z within the above-defined range, it becomes possible to control the size and shape of a resist pattern as desired.

The compound of formula (1) should have a weight average molecular weight (Mw) of 3,000 to 300,000, preferably 5,000 to 30,000. With Mw<3,000, a resist composition is less resistant to heat. With Mw>300,000, a resist composition becomes low in alkali dissolution and resolution.

In the base resin according to the present invention, a wide molecular weight dispersity (Mw/Mn) means that there are present low molecular weight polymers and high molecular weight polymers. If low molecular weight polymers are predominant, heat resistance would be poor. If high molecular weight polymers are predominant, which means the presence of less alkali soluble components, a footing phenomenon occurs after pattern formation. As the pattern rule becomes finer, the influence of molecular weight and its dispersity becomes more significant. In order to provide a resist composition suitable for processing to fine pattern dimensions, the base resin is preferably a monodisperse polymer having a dispersity of 1.0 to 1.5, especially 1.0 to 1.3.

The base resin is preferably blended in an amount of 70 to 90 parts by weight, more preferably 75 to 85 parts by weight.

Several illustrative examples of the photoacid generator (C) are given below.

Onium salts include
diphenyliodonium trifluoromethanesulfonate,
(p-tert-butoxyphenyl)phenyliodonium trifluoromethanesulfonate,
diphenyliodonium p-toluenesulfonate,
(p-tert-butoxyphenyl)phenyliodonium p-toluenesulfonate,
triphenylsulfonium trifluoromethanesulfonate,
(p-tert-butoxyphenyl)diphenylsulfonium trifluoromethanesulfonate,
bis(p-tert-butoxyphenyl)phenylsulfonium trifluoromethanesulfonate,
tris(p-tert-butoxyphenyl)sulfonium trifluoromethanesulfonate,
triphenylsulfonium p-toluenesulfonate,
(p-tert-butoxyphenyl)diphenylsulfonium p-toluenesulfonate,
bis(p-tert-butoxyphenyl)phenylsulfonium p-toluenesulfonate,
tris(p-tert-butoxyphenyl)sulfonium p-toluenesulfonate,
triphenylsulfonium nonafluorobutanesulfonate,
triphenylsulfonium butanesulfonate,
trimethylsulfonium trifluoromethanesulfonate,
trimethylsulfonium p-toluenesulfonate,
cyclohexylmethyl(2-oxocyclohexyl)sulfonium trifluoromethanesulfonate,
cyclohexylmethyl(2-oxocyclohexyl)sulfonium p-toluenesulfonate,
dimethylphenylsulfonium trifluoromethanesulfonate,
dimethylphenylsulfonium p-toluenesulfonate,
dicyclohexylphenylsulfonium trifluoromethanesulfonate, and
dicyclohexylphenylsulfonium p-toluenesulfonate.

Other useful photoacid generators include
β-ketosulfonate derivatives such as 2-cyclohexylcarbonyl-2-(p-toluenesulfonyl)propane and 2-isopropylcarbonyl-2-(p-toluenesulfonyl)propane; diazomethane derivatives such as bis(benzenesulfonyl)diazomethane, bis(cyclohexylsulfonyl)diazomethane, and bis(tert-butylsulfonyl)diazomethane;
disulfone derivatives such as diphenyl disulfone and dicyclohexyl disulfone; nitrobenzyl sulfonate derivatives such as 2,6-dinitrobenzyl p-toluenesulfonate and 2,4-dinitrobenzyl p-toluenesulfonate; sulfonate ester derivatives such as 1,2,3-tris(methanesulfonyloxy)benzene, 1,2,3-tris(trifluoromethanesulfonyloxy)benzene, and 1,2,3-tris(p-toluenesulfonyloxy)benzene; and imide-yl sulfonates such as phthalimide-yl triflate, phthalimide-yl tosylate, 5-norbornene-2,3-dicarboxyimide-yl triflate, 5-norbornene-2,3-dicarboxyimide-yl tosylate, and 5-norbornene-2,3-dicarboxyimide-yl n-butylsulfonate.

Preferred among others are triphenylsulfonium trifluoromethanesulfonate, (p-tert-butoxyphenyl)diphenylsulfonium trifluoromethanesulfonate, tris(p-tertbutoxyphenyl)sulfonium trifluoromethanesulfonate, triphenyl-sulfonium p-toluenesulfonate, (p-tert-butoxyphenyl)diphenylsulfonium p-toluenesulfonate, and tris(p-tert-butoxyphenyl)sulfonium p-toluenesulfonate. The photoacid generators may be used alone or in admixture of two or more.

Desirably, the photoacid generator is added in an amount of 0.5 to 15 parts, especially 1 to 8 parts by weight. sensitivity would be low with less than 0.5 part of the photoacid generator. More than 15 parts of the photoacid generator would lower an alkali dissolution rate to detract from resolution. Additionally heat resistance lowers because monomeric components become excessive.

Component (D) is an aromatic compound having a group: ≡C—COOH in a molecule. It is preferably at least one compound selected from the following groups I and II though not limited thereto.

Group I includes compounds of the following general formulae (4) to (13) wherein some or all of the hydrogen atoms of phenolic hydroxyl groups are replaced by —$R^{13}$—COOH wherein $R^{13}$ is a normal or branched alkylene group having 1 to 10 carbon atoms and a molar fraction B/(A+B) has a value of from 0.1 to 1.0 wherein A and B are the moles of the phenolic hydroxyl group and the group represented by ≡C—COOH in the molecule, respectively.

Group II includes compounds of the following general formulae (14) and (15).

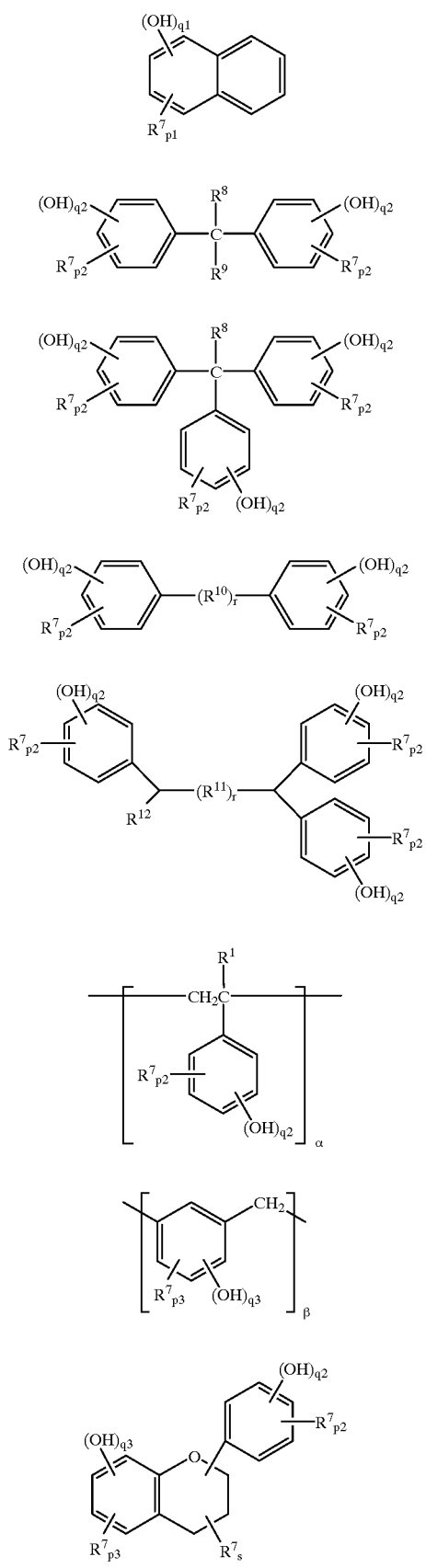

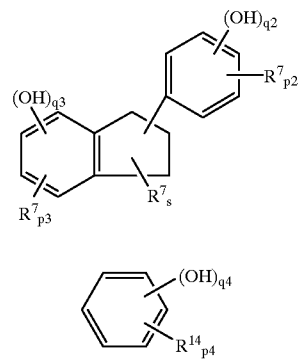

In the formulae, $R^1$ is hydrogen or methyl; each of $R^7$ and $R^8$ is hydrogen or a normal or branched alkyl or alkenyl group having 1 to 8 carbon atoms; $R^9$ is hydrogen, a normal or branched alkyl or alkenyl group having 1 to 8 carbon atoms or a group of $-(R^{13})_r-COOR'$ wherein R' is hydrogen or $-R^{13}-COOH$; $R^{10}$ is a group: $-(CH_2)_t-$ wherein t is a number of 2 to 10, arylene group having 6 to 10 carbon atoms, carbonyl group, sulfonyl group, oxygen atom or sulfur atom; $R^{11}$ is an alkylene group having 1 to 10 carbon atoms, arylene group having 6 to 10 carbon atoms, carbonyl group, sulfonyl group, oxygen atom or sulfur atom; $R^{12}$ is hydrogen, a normal or branched alkyl group having 1 to 8 carbon atoms, normal or branched alkenyl group having 1 to 8 carbon atoms, hydroxyl-substituted phenyl or hydroxyl-substituted naphthyl group; $R^{13}$ is a normal or branched alkylene group having 1 to 10 carbon atoms; and $R^{14}$ is hydrogen, a normal or branched alkyl group having 1 to 8 carbon atoms, normal or branched alkenyl group having 1 to 8 carbon atoms or $-R^{13}-COOH$ group. Letter s is an integer of 0 to 5, r is equal to 0 or 1, p1, q1, p2, q2, p3, q3, p4, and q4 are numbers satisfying p1+q1=8, p2+q2=5, p3+q3=4, and p4+q4=6, such that at least one hydroxyl group is contained in each phenyl skeleton. α is such a number that the compound of formula (9) has a weight average molecular weight of 1,000 to 5,000. β is such a number that the compound of formula (10) has a weight average molecular weight of 1,000 to 10,000.

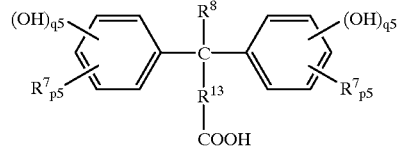

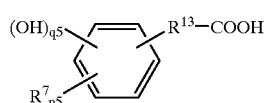

In the formulae, $R^7$, $R^8$, $R^{13}$, and r are as defined above, p5 and q5 are numbers satisfying p5≧0, q5≧0, and p5+q5=5.

Several illustrative non-limiting examples of component (D) are given below as compounds of formulae I-1 to I-14 and II-1 to II-6.

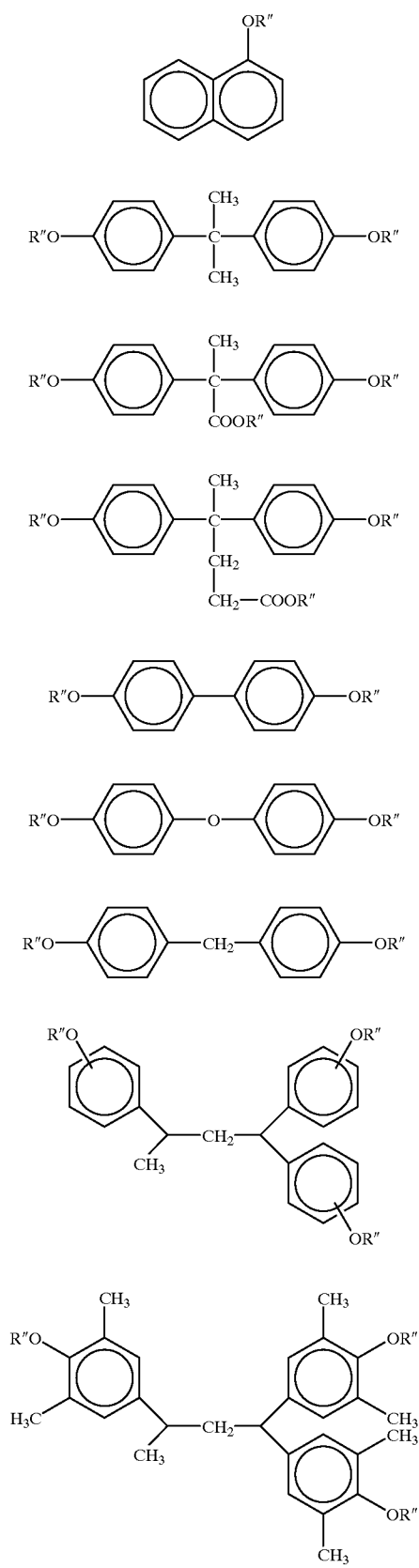
[I-1]
[I-2]
[I-3]
[I-4]
[I-5]
[I-6]
[I-7]
[I-8]
[I-9]
-continued
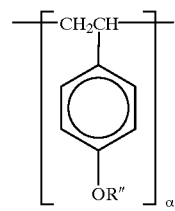
[I-10]
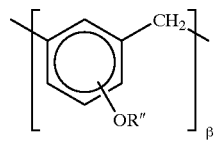
[I-11]
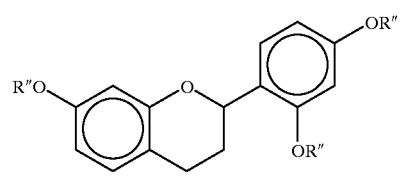
[I-12]
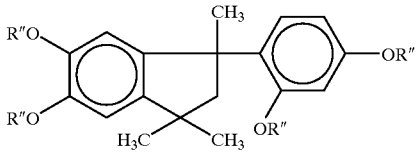
[I-13]
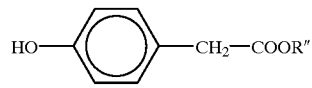
[I-14]
R" is hydrogen or $CH_2COOH$. In the related compounds, 10 to 100 mol% of R" is a $CH_2COOH$ group.
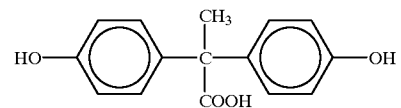
[II-1]
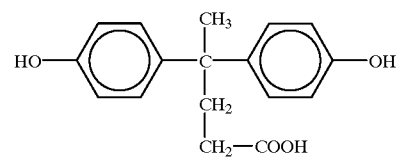
[II-2]
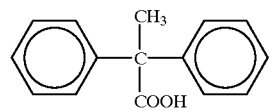
[II-3]
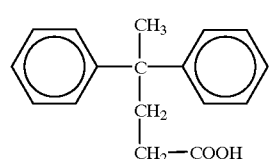
[II-4]

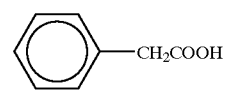
[II-5]

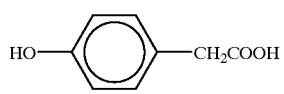
[II-6]

Preferably the aromatic compound having a group: ≡C—COOH in a molecule is blended in an amount of 0.1 to 5 parts, especially 1 to 3 parts by weight. Less than 0.1 part of the aromatic compound would be less effective for improving the footing on a nitride film substrate and PED whereas more than 5 parts of the aromatic compound would reduce the resolution of a resist composition. It is understood that the aromatic compounds having a group: ≡C—COOH in a molecule may be used alone or in admixture of two or more.

In the resist composition of the invention, a basic compound may be blended as component (E). The basic compound is preferably a compound which can suppress the diffusion rate at which the acid generated from the photoacid generator diffuses into a resist coating. The blending of such a basic compound suppresses the diffusion rate of acid in a resist coating to improve resolution, suppresses a change of sensitivity after exposure, and mitigates substrate and environment dependency, achieving improvements in exposure margin and pattern profile.

Included in the basic compound are primary, secondary and tertiary aliphatic amines, hybrid amines, aromatic amines, heterocyclic amines, carboxyl-bearing nitrogenous compounds, sulfonyl-bearing nitrogenous compounds, hydroxyl-bearing nitrogenous compounds, hydroxyphenyl-bearing nitrogenous compounds, alcoholic nitrogenous compounds, amide derivatives, and imide derivatives.

Examples of the primary aliphatic amine include ammonia, methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of the secondary aliphatic amine include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of the tertiary aliphatic amine include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of the hybrid amine include dimethylethylamine, methylethylpropylamine, benzylamine, phenethylamine, and benzyldimethylamine.

Examples of the aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazane derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinylpyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of the carboxyl-bearing nitrogenous compound include aminobenzoic acid, indolecarboxylic acid, amino acid derivatives such as nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine. Examples of the sulfonyl-bearing nitrogenous compound include 3-pyridinesulfonic acid and pyridinium p-toluenesulfonate. Examples of the hydroxyl-bearing nitrogenous compound, hydroxyphenyl-bearing nitrogenous compound, and alcoholic nitrogenous compound include 2-hydroxypyridine, aminocresole, 2,4-quinoline diol, 3-indolemethanol hydrate, triethanolamine, N-ethyldiethanolamine, N, N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl) pyrrolidine, 1-(2-hydroxyethyl)-2-pyrrolidinone, 3-piperidino-1,2-propane diol, 3-pyrrolidino-1,2-propane diol, 3-quinuclidinol, 3-tropanol, 1-methyl-2-pyrrolidine ethanol, 1-aziridine ethanol, N-(2-hydroxyethyl) phthalimide, and N-(2-hydroxyethyl)iso-nicotinamide.

Examples of the amide derivative include formamide, N-methylformamide, N,N-dimethylformamide, acetamide, N-methylacetamide, N,N-dimethylacetamide, propionamide, and benzamide. Exemplary imide derivatives are phthalimide, succinimide, and maleimide. Preferred among others are triethylamine, N,N-dimethylaniline, N-methylpyrrolidone, pyridine, quinoline, nicotinic acid, triethanolamine, piperidine ethanol, N,N-dimethylacetamide, and succinimide.

Preferably the basic compound is blended in an amount of 0 to about 2 parts, especially about 0.01 to 1 part by weight. More than 2 parts of the basic compound would adversely affect sensitivity. The basic compounds may be used alone or in admixture of two or more.

The resist composition of the invention may further contain various additives, for example, a surfactant for facilitating coating and a light-absorbing agent for reducing irregular reflection from the substrate. The amounts of such optional additives blended are conventional insofar as the objects of the invention are not impaired. Examples of the surfactant include perfluoroalkylpolyoxyethylene ethanols, fluorinated alkyl esters, and perfluoroalkylamine oxides. Examples of the light-absorbing agent include diaryl sulfoxides, diaryl sulfones, 9,10-dimethylanthracene, and 9-fluorenone.

Any well-known lithography may be used to form a resist pattern from a positive resist composition of the invention. For example, the resist composition is spin coated onto a nitride film substrate (e.g., titanium nitride and silicon nitride substrates), prebaked at 80 to 120° C. to form a resist film of 0.5 to 2.0 μm thick, exposed to actinic radiation such as deep-UV, electron beam, and X-ray, and baked at 70 to 120° C. for 30 to 200 seconds (post-exposure baking=PEB), and developed with an aqueous base solution. The resist composition of the invention is especially suitable for fine patterning with deep-UV radiation of 254 to 193 nm and X-ray.

There has been described a chemically amplified positive resist composition which is highly sensitive to actinic radiation, especially KrF excimer laser light and X-ray, has improved sensitivity, resolution and plasma etching resistance. In addition, the composition is improved in the footing on nitride film substrates and PED.

EXAMPLE

Examples of the present invention are given below by way of illustration and not by way of limitation. All parts are by weight.

Examples 1–17 & Comparative Example 1–4

Liquid resist compositions were prepared by dissolving a polyhydroxystyrene having some hydrogen atoms of hydroxyl groups replaced by acid labile groups designated Polym.1 to Polym.4, a photoacid generator selected from onium salts designated PAG.1 to PAG.4, an aromatic compound having a group ≡C—COOH within a molecule designated ACC.1 to ACC.5, a basic compound as shown in Table 1, and 0.1 part of a surfactant Florade FC-430 by Sumitomo 3M K.K. in a solvent in accordance with the formulation shown in Table 1.

Each of the compositions was passed through a 0.1-μm Teflon® filter. The liquid resist composition was then spin coated onto a titanium nitride substrate to a thickness of 0.7 μm. With the substrate rested on a hot plate at 100° C., the coating was pre-baked for 90 seconds. The film was exposed to light by means of an excimer laser stepper model NSR-2005EX (manufactured by Nikon K.K., numerical aperture NA =0.5), baked at 110° C. for 90 seconds (PEB), and developed with an aqueous solution of 2.38% tetramethylammonium hydroxide, obtaining a positive pattern.

The resulting resist pattern was evaluated as follows. First, a sensitivity (Eth value) was determined. Provided that the exposure dose with which the top and bottom of a 0.26-μm line-and-space pattern were resolved at 1:1 was the optimum exposure dose (sensitivity Eop), the minimum line width of a line-and-space pattern which was recognized separate at this exposure dose was the resolution of a test resist. The profile of the resist pattern thus resolved was observed under a scanning electron microscope (SEM). The post-exposure delay (PED) stability of the resist was evaluated by exposing the resist with the optimum exposure dose and varying the time to allow the resist to stand (PED time) prior to PEB. The PED stability was evaluated in terms of the PED time when a change of the resist pattern shape was observed, for example, the line pattern assumed a T-top profile or became unresolvable. The longer the PED time, the greater is the PED stability.

The formulation of the resist compositions is shown in Table 1. The test results of Examples and Comparative Examples are shown in Tables 2 and 3, respectively.

TABLE 1

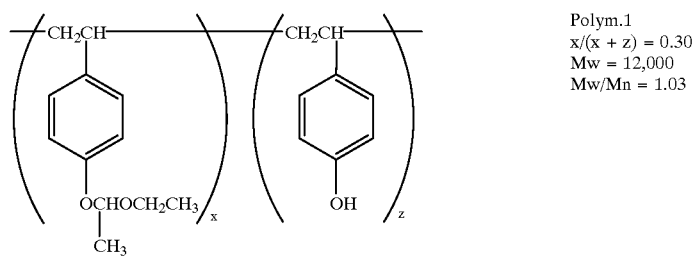

Polym.1
x/(x + z) = 0.30
Mw = 12,000
Mw/Mn = 1.03

TABLE 1-continued
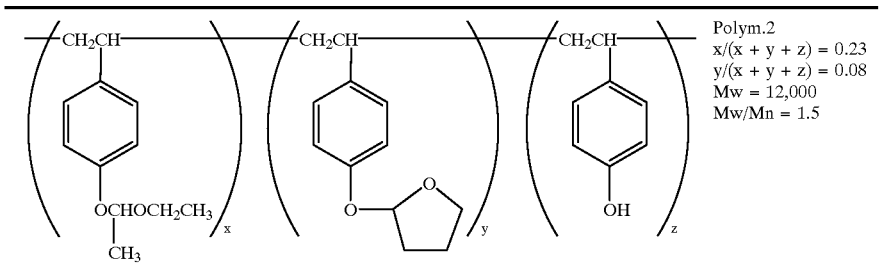
Polym.2
x/(x + y + z) = 0.23
y/(x + y + z) = 0.08
Mw = 12,000
Mw/Mn = 1.5
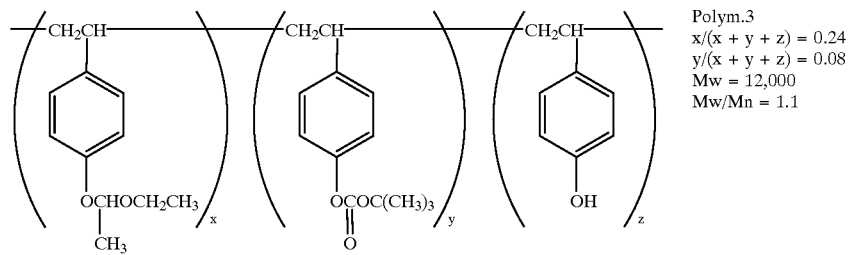
Polym.3
x/(x + y + z) = 0.24
y/(x + y + z) = 0.08
Mw = 12,000
Mw/Mn = 1.1
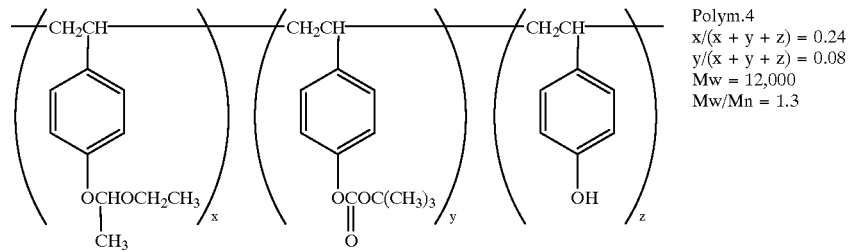
Polym.4
x/(x + y + z) = 0.24
y/(x + y + z) = 0.08
Mw = 12,000
Mw/Mn = 1.3
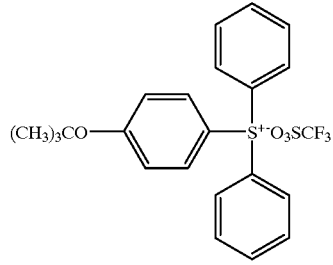
PAG.1
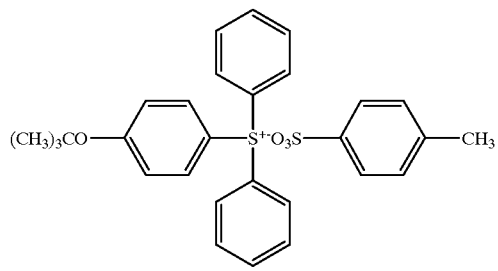
PAG.2
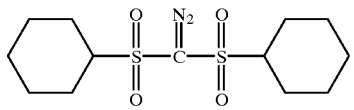
PAG.3
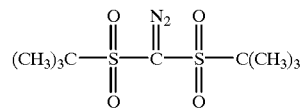
PAG.4

TABLE 1-continued

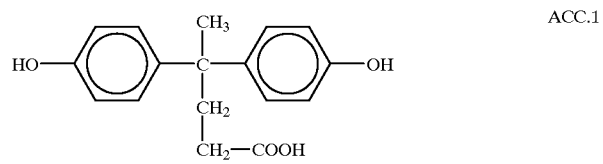

ACC.1

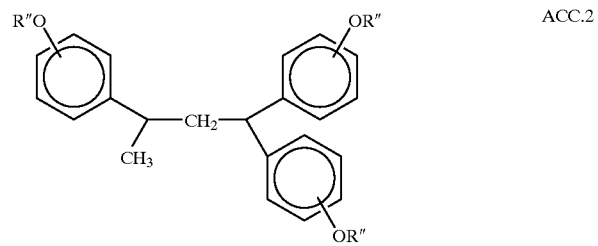

ACC.2

$$\left[ \begin{array}{c} R'' = H \text{ or } CH_2COOH \\ \dfrac{[CH_2COOH]}{[H] + [CH_2COOH]} = 0.5 \end{array} \right]$$

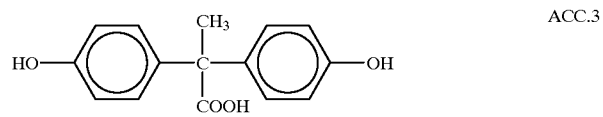

ACC.3

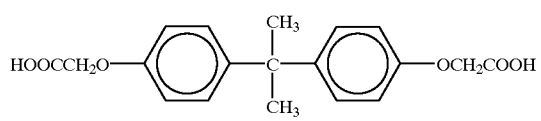

ACC.4

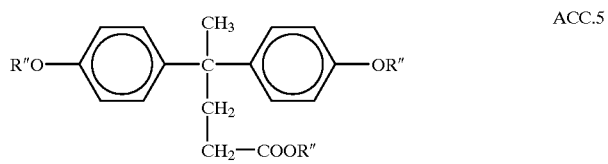

ACC.5

$$\left[ \begin{array}{c} R'' = CH_2COOH \\ \dfrac{[CH_2COOH]}{[H] + [CH_2COOH]} = 1 \end{array} \right]$$

| No. | Base resin | Photoacid generator | (D) | Basic Compound | Organic solvent |
|---|---|---|---|---|---|
| 1 | Polym.1 (80) | PAG.1 (4) | ACC.1 (1) | — | DGLM (300) |
| 2 | Polym.1 (80) | PAG.1 (4) | ACC.1 (1) | N-methylpyrrolidone (0.1) | DGLM (300) |
| 3 | Polym.1 (80) | PAG.2 (4) | ACC.2 (1) | — | EIPA (580) |
| 4 | Polym.1 (80) | PAG.2 (4) | ACC.2 (1) | quinoline (0.06) | EIPA (580) |
| 5 | Polym.2 (80) | PAG.3 (4) | ACC.3 (2) | — | EL/BA (510) |
| 6 | Polym.2 (80) | PAG.4 (4) | ACC.4 (2) | N,N-dimethylacetamide (5.0) | EL/BA (510) |
| 7 | Polym.3 (80) | PAG.2 (2) | ACC.1 (1) | — | PGMEA (530) |
| 8 | Polym.3 (80) | PAG.2 (4) | ACC.1 (0.5) | — | PGMEA (530) |
| 9 | Polym.3 (80) | PAG.2 (8) | ACC.1 (0.2) | — | PGMEA (530) |
| 10 | Polym.3 | PAG.2 | ACC.1 | triethanolamine (0.06) | PGMEA |

TABLE 1-continued

| | | | | | |
|---|---|---|---|---|---|
| | (80) | (2) | (1) | | (530) |
| 11 | Polym.3 | PAG.2(1) | ACC.1 | triethanolamine (0.06) | PGMEA |
| | (80) | PAG.4(2) | (1) | | (530) |
| 12 | Polym.4 | PAG.2 | ACC.4(1) | — | PGMEA |
| | (80) | (1) | ACC.5(1) | | (530) |
| 13 | Polym.4 | PAG.2 | ACC.4(1) | piperidien ethanol (0.08) | PGMEA |
| | (80) | (1) | ACC.5(1) | | (530) |
| 14 | Polym.3 | PAG.2(1) | ACC.1 | — | PGMEA |
| | (80) | PAG.3(2) | (1.5) | | (530) |
| 15 | Polym.3 | PAG.2(1) | ACC.1 | triethanolamine (0.06) | PGMEA |
| | (80) | PAG.3(2) | (1.5) | | (530) |
| 16 | Polym.3 | PAG.2 | ACC.3 | — | PGMEA |
| | (80) | (2) | (1.5) | | (530) |
| 17 | Polym.3 | PAG.2 | ACC.3 | tributylamine (0.03) | PGMEA |
| | (80) | (2) | (1.5) | N,N-dimethylacetamide (5.0) | (530) |
| 18 | Polym.1 | PAG.1 | — | — | DGLM |
| | (80) | (4) | | | (300) |
| 19 | Polym.1 | PAG.1 | — | N-methylpyrrolidone (0.1) | DGLM |
| | (80) | (4) | | | (300) |
| 20 | Polym.3 | PAG.2 | — | — | PGMEA |
| | (80) | (2) | | | (530) |
| 21 | Polym.3 | PAG.2 | — | tributylamine (0.03) | PGMEA |
| | (80) | (2) | | N,N-dimethylacetamide (5.0) | (530) |

Note: The abbreviations under the heading of "solvent" have the following meaning.
DGLM: 2-methoxyethyl ether
EIPA: 1-ethoxy-2-propanol
EL/BA: a 85%/15% by weight mixture of ethyl lactate and butyl acetate
PGMEA: propylene glycol monomethyl ether acetate Note: The abbreviations under the heading of "solvent" have the following meaning.

DGLM: 2-methoxyethyl ether

EIPA: 1-ethoxy-2-propanol

EL/BA: a 85%/15% by weight mixture of ethyl lactate and butyl acetate

PGMEA: propylene glycol monomethyl ether acetate

TABLE 2

| | Resist composition No. tested | Resolution | | | PED stabilitiy (min.) |
|---|---|---|---|---|---|
| Example | | Eop (mJ/cm$^2$) | ($\mu$m) | Profile | |
| 1 | 1 | 5.2 | 0.22 | rectangular | ≧120 |
| 2 | 2 | 19.0 | 0.20 | rectangular | ≧120 |
| 3 | 3 | 3.9 | 0.22 | rectangular | ≧120 |
| 4 | 4 | 7.8 | 0.20 | rectangular | ≧120 |
| 5 | 5 | 4.0 | 0.22 | rectangular | ≧120 |
| 6 | 6 | 10.0 | 0.20 | rectangular | ≧120 |
| 7 | 7 | 5.5 | 0.22 | rectangular | ≧120 |
| 8 | 8 | 5.5 | 0.22 | rectangular | ≧120 |
| 9 | 9 | 5.5 | 0.22 | rectangular | ≧120 |
| 10 | 10 | 9.0 | 0.20 | rectangular | ≧120 |
| 11 | 11 | 9.5 | 0.20 | rectangular | ≧120 |
| 12 | 12 | 16.0 | 0.22 | rectangular | ≧120 |
| 13 | 13 | 65.0 | 0.20 | rectangular | ≧120 |
| 14 | 14 | 5.2 | 0.22 | rectangular | ≧120 |
| 15 | 15 | 29.0 | 0.20 | rectangular | ≧120 |
| 16 | 16 | 4.0 | 0.22 | rectangular | ≧120 |
| 17 | 17 | 22.0 | 0.20 | rectangular | ≧120 |

TABLE 3

| | Resist composition No. tested | Resolution | | | PED stabilitiy (min.) |
|---|---|---|---|---|---|
| Comparative Example | | Eop (mJ/cm$^2$) | ($\mu$m) | Profile | |
| 1 | 18 | 4.0 | 0.24 | footing | 30–60 |
| 2 | 19 | 18.0 | 0.24 | footing | 30–60 |
| 3 | 20 | 4.0 | 0.24 | footing | 30–60 |
| 4 | 21 | 21.0 | 0.24 | footing | 30–60 |

Japanese Patent Application No. 188461/1996 is incorporated herein by reference.

Although some preferred embodiments have been described, many modifications and variations may be made thereto in the light of the above teachings. It is therefore to be understood that within the scope of the appended claims, the invention may be practiced otherwise than as specifically described.

We claim:

1. A chemically amplified positive resist composition comprising (A) an organic solvent (B) a base resin, (C) a photoacid generator, and (D) an aromatic compound having a group —R$^{13}$—COOH wherein R$^{13}$ is a normal or branched alkylene group having 1 to 10 carbon atoms, said base resin (B) being a polymer of the following general formula (1):

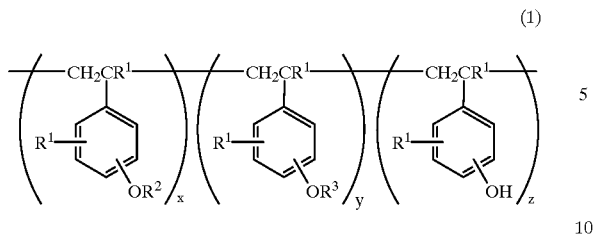
(1)

wherein $R^1$ is hydrogen or methyl,
$R^2$ is a group of the following general formula (2):

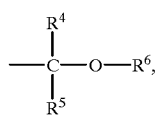
(2)

$R^3$ is an acid labile group different from $R^2$, $R^4$ and $R^5$ are independently selected from the group consisting of hydrogen and normal or branched alkyl groups having 1 to 6 carbon atoms, $R^6$ is a normal, branched or cyclic alkyl group having 1 to 10 carbon atoms, or $R^4$ and $R^5$, $R^4$ and $R^6$, or $R^5$ and $R^6$, taken together, optionally form a ring, and $R^4$, $R^5$ and $R^6$ are independently selected from normal or branched alkylene groups having 1 to 6 carbon atoms when they form a ring, letters x, y and z are each a positive number and x, y and z satisfy the relationships: $0 \leq x/(x+y+z) \leq 0.5$, $0 \leq y/(x+y+z) \leq 0.5$, and $0.4 \leq z/(x++y+z) \leq 0.9$, said polymer having a weight average molecular weight of 3,000 to 300,000.

2. The resist composition of claim 1 wherein the polymer as base resin (B) is of the following general formula (3):

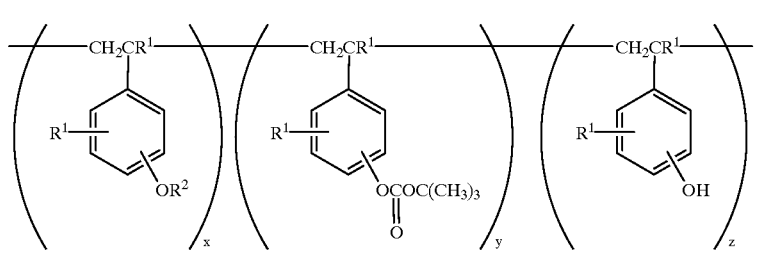
(3)

wherein $R^1$, $R^2$, x, y, and z are as defined above.

3. The resist composition of claim 1 wherein the compound (D) is at least one compound selected from the following groups I and II:

Group I:
compounds of the following general formulae (4) to (13) wherein some or all of the hydrogen atoms of phenolic hydroxyl groups are replaced by —$R^{13}$—COOH wherein $R^{13}$ is a normal or branched alkylene group having 1 to 10 carbon atoms and a molar fraction B/(A+B) has a value of 0.1 to 1.0 wherein A and B are the moles of the phenolic hydroxyl group and the group represented by $R^{13}$—COOH in the molecule, respectively,

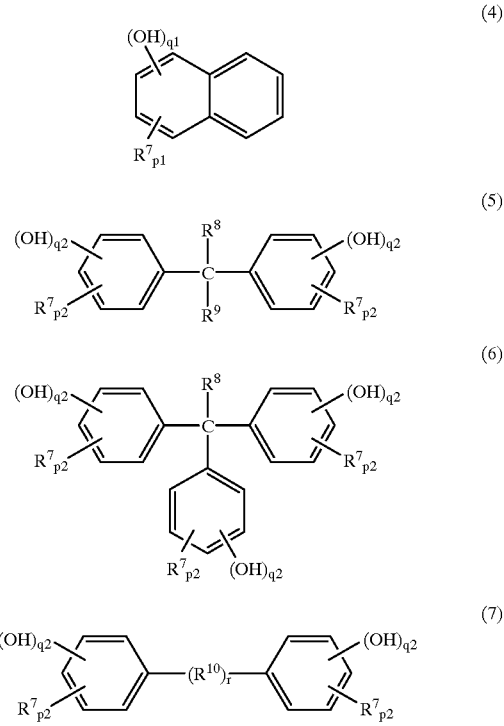

-continued

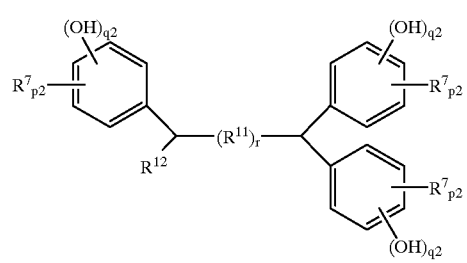

-continued

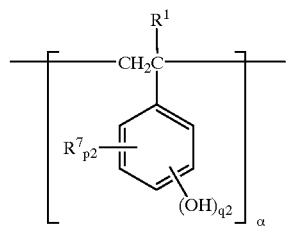

(9)

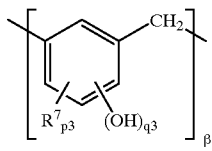

(10)

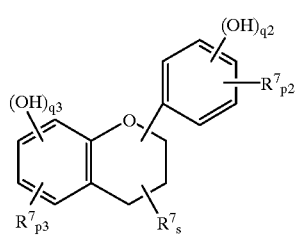

(11)

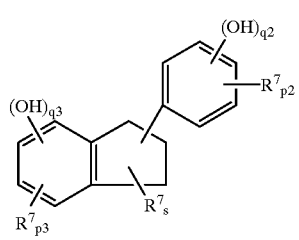

(12)

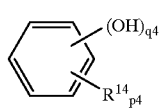

(13)

wherein $R^1$ is hydrogen or methyl; each of $R^7$ and $R^8$ is hydrogen or a normal or branched alkyl or alkenyl group having 1 to 8 carbon atoms; $R^9$ is hydrogen, a normal or branched alkyl or alkenyl group having 1 to 8 carbon atoms or a group $—(R^{13})_r—COOR'$ wherein R' is hydrogen or $—R^{13}—COOH$; $R^{10}$ is selected from the group consisting of $—(CH_2)_t—$ wherein t is a number of 2 to 10, an arylene group having 6 to 10 carbon atoms, carbonyl group, sulfonyl group, oxygen atom, and sulfur atom; $R^{11}$ is selected from the group consisting of an alkylene group having 1 to 10 carbon atoms, arylene group having 6 to 10 carbon atoms, carbonyl group, sulfonyl group, oxygen atom, and sulfur atom; $R^{12}$ is selected from the group consisting of hydrogen, a normal or branched alkyl group having 1 to 8 carbon atoms, a normal or branched alkenyl group having 1 to 8 carbon atoms, hydroxyl-substituted phenyl and hydroxyl-substituted naphthyl group; $R^{13}$ is a normal or branched alkylene group having 1 to 10 carbon atoms; $R^{14}$ is hydrogen, a normal or branched alkyl or alkenyl group having 1 to 8 carbon atoms, or a group $—R^{13}—COOH$; letter s is an integer of 0 to 5, r is equal to 0 or 1, p1, q1, p2, q2, p3, q3, p4, and q4 are numbers satisfying p1+q1=8, p2+q2=5, p3+q3=4, and p4+q4=6, such that at least one hydroxyl group is contained in each phenyl skeleton, a is such a number that the compound of formula (9) has α weight average molecular weight of 1,000 to 5,000, and β is such a number that the compound of formula (10) has a weight average molecular weight of 1,000 to 10,000, Group II:

compounds of the following general formulae (14) and (15):

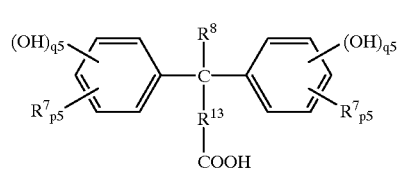

(14)

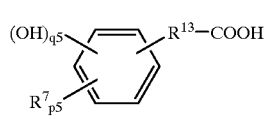

(15)

wherein $R^7$, $R^8$, $R^{13}$, and r are as defined above, p5 and q5 are numbers satisfying p5≧0, q5≧0, and p5+q5=5.

4. The resist composition of claim 1 wherein the polymer as base resin (B) is a monodisperse polymer having a dispersity of 1.0 to 1.5.

5. The resist composition of claim 1 further comprising (E) a basic compound.

6. The resist composition of claim 1 wherein the photoacid generator (C) is an onium salt.

7. The composition of claim 1, which contains, in parts by weight, 150 to 700 parts of the organic solvent (A), 70 to 90 parts of the base resin (B), 0.5 to 15 parts of the photoacid generator (C), and 0.1 to 5 parts of the aromatic compound (D).

8. The composition of claim 1, which contains, in parts by weight, 250 to 500 parts of the organic solvent (A), 75 to 85 parts of the base resin (B), 1 to 8 parts of the photoacid generator (C), and 1 to 3 parts of the aromatic compound (D).

9. The composition of claim 5, which contains, in parts by weight, 150 to 700 parts of the organic solvent (A), 70 to 90 parts of the base resin (B), 0.5 to 15 parts of the photoacid generator (C), 0.1 to 5 parts of the aromatic compound (D), and 0.01 to 2 parts of basic compound (E).

10. The composition of claim 1, wherein the organic solvent, (A), is 1-ethoxy-2-propanol, propylene glycol monomethyl ether acetate or a mixture thereof.

11. The composition of claim 1, wherein, in formula (1), $R^3$, is a normal, branched or cyclic acetal group different from $R^2$ or a tert-butyl, tert-butoxycarbonyl, tert-butoxycarbonylmethyl or 3-oxycyclohexyl group.

12. The composition of claim 1, wherein $R^2$ is 1-ethoxyethyl, 1-n-butoxyethyl or 1-ethoxy-n-propyl and $R^3$ is tert-butoxycarbonyl.

13. The composition of claim 1, wherein the base resin, (B), has a weight average molecular weight of 5,000 to 30,000.

14. The resist composition of claim 1, wherein in formula (2), $R^4$ is hydrogen, $R^5$ is selected from the group consisting of hydrogen and normal or branched alkyl groups having 1 to 6 carbon atoms, $R^6$ is a normal, branched or cyclic alkyl group having 1 to 10 carbon atoms, or $R^5$ and $R^6$, taken together, optionally form a ring, and $R^5$ and $R^6$ are independently selected from normal or branched alkylene groups having 1 to 6 carbon atoms when they form a ring.

* * * * *